US007342807B2

(12) United States Patent  (10) Patent No.: US 7,342,807 B2
Mueller et al.  (45) Date of Patent: Mar. 11, 2008

(54) MODULES FOR A MEASURING DEVICE AND MEASURING DEVICE

(75) Inventors: Torsten Mueller, Zirndorf (DE); Birgit Seitz, Munich (DE); Reiner Hausdorf, Ottobrunn (DE); Rudolf Reckziegel, Dresden (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 11/621,526

(22) Filed: Jan. 9, 2007

(65) Prior Publication Data

US 2007/0109755 A1 May 17, 2007

Related U.S. Application Data

(62) Division of application No. 10/534,610, filed as application No. PCT/EP03/13772 on Dec. 5, 2003.

(30) Foreign Application Priority Data

Jan. 3, 2003 (DE) ................. 103 00 072
Jan. 12, 2003 (DE) ................. 103 26 388

(51) Int. Cl.
*H05K 7/10* (2006.01)
*H05K 7/14* (2006.01)
(52) U.S. Cl. ............. 361/796; 361/752; 361/728; 361/729; 361/730; 174/521
(58) Field of Classification Search ......... 361/752, 361/799, 818, 728–731, 796, 736, 800, 816, 361/797; 174/50, 521
See application file for complete search history.

(56) References Cited

U.S. PATENT DOCUMENTS

| 5,492,481 | A | | 2/1996 | Lewis |
|---|---|---|---|---|
| D373,573 | S | * | 9/1996 | Basco et al. ............... D14/340 |
| 5,746,326 | A | * | 5/1998 | Hong ...................... 211/41.17 |
| 6,011,701 | A | | 1/2000 | Kopp |
| 6,020,824 | A | * | 2/2000 | Tamura et al. ........... 340/815.5 |
| 6,144,561 | A | * | 11/2000 | Cannella et al. ............ 361/796 |
| 6,542,383 | B1 | * | 4/2003 | Tsuyuki et al. ............. 361/816 |
| 6,563,706 | B1 | * | 5/2003 | Strickler .................... 361/695 |
| 7,031,168 | B2 | * | 4/2006 | Kato et al. ................. 361/788 |
| 7,042,737 | B1 | * | 5/2006 | Woolsey et al. ............ 361/799 |
| 2001/0032847 | A1 | | 10/2001 | Cheng | |

FOREIGN PATENT DOCUMENTS

DE 100379 Z 9/1973

(Continued)

*Primary Examiner*—Tuan T. Dinh
*Assistant Examiner*—Dameon E Levi
(74) *Attorney, Agent, or Firm*—Christensen O'Connor Johnson Kindness PLLC

(57) ABSTRACT

The invention relates to a module for a measuring device and to a measuring device. The inventive module for a measuring device is provided with a plug-in contact element for the electrical contact of the plug-and-socket plate of the measuring device which is used for data transfer. Said module for the measuring device comprises a main circuit card arranged in the first circuit card space. Said first circuit card space is formed by at least one first element of the body which encompasses the circuit card in a closed manner on the level of the external periphery thereof.

5 Claims, 15 Drawing Sheets

FOREIGN PATENT DOCUMENTS

| | | |
|---|---|---|
| DE | 7936520 U1 | 3/1980 |
| DE | 3413533 A1 | 10/1985 |
| DE | 9002187.8 U1 | 6/1990 |
| DE | 3933643 A1 | 4/1991 |
| DE | 3933647 A1 | 4/1991 |
| DE | 3809605 C2 | 6/1992 |
| DE | G9217265.2 U1 | 5/1993 |
| DE | 4223935.4 A1 | 1/1994 |
| DE | 19509690.8 A1 | 9/1996 |
| EP | 0332793 A1 | 9/1989 |
| WO | WO8800790 A1 | 1/1988 |

\* cited by examiner

MODULES FOR A MEASURING DEVICE AND MEASURING DEVICE

BACKGROUND

The invention relates to plug-in measuring-device modules for insertion into a measuring device and a measuring device with measuring-device modules, which can be plugged into a measuring device housing.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

Building up measuring devices from several measuring-device modules which can be plugged into a housing is already known, for example, from DE 39 33 647 A1. In this document, the measuring device is formed from a housing, into which several plug-in components are inserted. The plug-in components are jointly connected to a plug-and-socket panel by means of which an electrical connection of the plug-in components is achieved. The individual plug-in components are combined in their function to form a complete measuring device.

The housing is designed to be inserted into a 19-inch rack, without the need to remove the plug-in component groups from the housing in order to fit them into a 19-inch rack of this kind. The plug-in component groups are inserted into the measuring device from the front. Accordingly, when inserting the housing into a 19-inch rack, all of the connections of the plug-in component groups are therefore accessible exclusively from the front. However, if the measuring device is to be used as a table-top device, it can be fitted with an information-output device arranged as a functional unit at the rear of the measuring device. The information-output device extends over the entire width of the measuring device. To operate the measuring device, it must be rotated so that the information-output device is facing towards the operator. The connections, which are arranged on the individual plug-in component groups, are at the same time turned away from the operator, so that a connection, for example, of a measuring line, is possible only at the side facing away from the operator.

Such measuring-device modules have the disadvantage that a module, which provides the appropriate structural space for the necessary electronic components, must be specially constructed for each module type. In the case of plug-in component groups with a small space requirement, the use of standardized parts is therefore only possible if a corresponding empty space is acceptable.

With the measuring device described, it is disadvantageous that a connection of a measuring line is not possible at the side facing the operator.

A further disadvantage is that a mobile use of the measuring device is only possible under limited conditions, because a protective device against vibrations is not provided for the individual plug-in component groups. The reliability of this measuring device is considerably reduced because of the absence of such a protective device against vibrations, which may occur, for example, when the device is put down at a measuring station.

A further disadvantage is that, with the device proposed, the individual plug-in component groups form a complete functional unit only in combination with one another. It is therefore necessary to calibrate the measuring device in its entirety including all of the co-operating plug-in component groups. Replacement of an individual plug-in component group is not possible without re-calibrating the measuring device.

The object of the present invention is to create a measuring-device module, which satisfies different structural space requirements with an extensive use of standardized parts, and to create a measuring device with plug-in measuring-device modules, which allows convenient operation by an operator from the side with the display device.

This object is achieved by the measuring-device modules as defined according to the invention in the claims.

Each individual measuring-device module provides a first printed-circuit-board space and a second printed-circuit-board space. The use of such mutually separate spaces allows the possibility of arranging those components, which are sensitive particularly with regard to their high-frequency behavior, for example, in the first printed-circuit-board space, and of protecting this space from electromagnetic radiation with special protective measures. Such protective measures can also be arranged on the printed-circuit board itself, for example, by means of a metallic covering of the components. This allows an open design of the measuring-device module, which leads to a better flow of cooling air.

Moreover, it is advantageous if the measuring-device module is built up from at least one frame element, of which the external periphery surrounds the printed-circuit board arranged inside it in an essentially enclosed manner. The use of frame elements allows the achievement of a variable system with a high degree of symmetry. This means that production costs can be kept to a minimum in view of the small number of different parts to be manufactured.

Advantageous further developments of the measuring device and the measuring-device modules according to the invention are possible with reference to the measures defined in the dependent claims.

In particular, it is advantageous, if, in addition to the connections arranged at the front of the device, further connections, which are arranged on the individual measuring-device modules, are provided at the rear of the device as input or output connections. As a result, those connections, which must frequently be linked to different lines by the operator, can be arranged at the front of the measuring device, while other connections, which are used less frequently, can be arranged at the rear. This leaves a large area at the front of the measuring device, which is available either for the arrangement of operating elements or for a large display.

Moreover, it is advantageous to fit the measuring-device modules into the measuring device by means of a guide device, wherein the guide device has at least one resiliently deformable guide element, which is capable of reducing the hardness of any impact acting on the measuring-device module as a result of a vibration. The reliability and operating life of the measuring device is considerably improved because of the correspondingly reduced acceleration acting on all of the components contained in the respective measuring-device module.

In this context, the grid dimension of the guide devices is advantageously selected so that, between each adjacent measuring-device module, in the region of the first printed-circuit-board spaces, a slight gap is formed through which an air flow is guided in order to cool the measuring-device modules. To prevent a tilting or rotary movement of the inserted measuring-device modules, the guide elements are preferably formed from a number of resilient tongues arranged in a row.

The plug-and-socket panel is mounted in a floating manner within the measuring-device housing in order to prevent the measuring-device modules from damaging the connection sockets formed on the plug-and-socket panel as they move during a vibration and to balance tolerances. In this context, the mounting is preferably designed so that a displacement of the plug-and-socket panel can only take place by overcoming a certain frictional force, so that a vibration of the measuring device as a whole leads to a considerable damping of the movement of the individual measuring-device modules.

By particular preference, the measuring-device modules are designed as, per se, enclosed functional units. This means that each measuring-device module provides the full functional scope of a measuring device. In this context, the connections, by means of which a measuring-device module is connected, are used on the one hand, to connect a device or a component group to be measured and, on the other hand, to connect the measuring-device module to a bus system, which is provided according to one preferred embodiment of the plug-and-socket panel. The data produced by a measuring-device module are supplied via this bus system to other measuring-device modules or to external computer systems for further processing. In addition to transferring parameter sets for the implementation of a measurement to the relevant measuring-device modules, the bus system is also used for supplying electrical energy to the measuring-device modules. For this purpose, a power pack designed as a plug-in module is provided, which makes use of the grid dimension of the measuring-device modules used, but occupies several grid units, and which is also connected via a plug connection to the plug-and-socket panel.

Furthermore, it is advantageous that each base element of a measuring-device module can be connected to another base element and that each second printed-circuit-board space of the two connected base elements forms a common additional printed-circuit-board space. In this case, each first printed-circuit-board space is a separate, enclosed space for each base element, which has only one or more locally limited openings for the passage of parts of a main printed-circuit board. In each first printed-circuit-board space, one main printed-circuit board is accommodated respectively, the two main printed-circuit boards preferably being connected via an additional printed-circuit board arranged in the additional printed-circuit-board space. Accordingly, the two base elements, connected via an additional printed-circuit board in the additional printed-circuit-board space, jointly form a measuring-device module, which is plugged into the measuring device. The two main printed-circuit boards can also be connected by a cable or may have a direct plug connection in the additional printed-circuit-board space.

Moreover, the second printed-circuit-board space can be extended to form an additional printed-circuit-board space by connecting one base element to a frame element instead of the second base element; as a result of the additional printed-circuit-board space, an enlarged region is provided in which the main printed-circuit board of the measuring-device module can be connected.

Opposite to a connection of this kind provided in the region of the second printed-circuit-board space, a connection carrier, on which an additional electrical connection is arranged, is advantageously provided on the base element. While the connections provided in the region of the second printed-circuit-board space are orientated towards the rear of the device, the additional electrical connection is positioned, by means of the connection carrier, so far in the direction of the front of the measuring device that, when the measuring-device module is inserted, it can be inserted through the recess in the front of the device and can be operated from the front.

With the base element made from two frame elements, which can be connected together to form a base frame, it is particularly advantageous if the frame elements are provided with centering elements on which the main printed-circuit board is centered within the base frame. The printed-circuit board is fixed between the two frame elements during assembly of the second frame element.

The connection between a measuring-device module and the plug-and-socket panel preferably takes place by means of a plug-in contact element, which is designed as a part of the main printed-circuit board and is guided from the first printed-circuit-board space through an appropriate recess in the base frame. For this purpose, the frame elements, which are preferably manufactured as cast parts, are milled, only one milled recess being preferably formed in each frame element when the base frame has been assembled, so that a groove provided to receive an HF seal does not need to be penetrated.

Frames which are open at both sides of the surface of the main printed-circuit board are preferably used as the frame elements. Cover plates are then fitted to the base frame, which consists of two frame elements of this kind, to form a closed base element. To improve cooling, the cover plates can have perforations through which the cooling air can flow into the measuring-device module. To attach the cover plates to the base frame, clip elements are provided, which are pushed over the cover plates from the external periphery of the base frame after placing the cover plates onto the base frame. Accordingly, the base frame and the cover plates are combined to form a base element by the attachment of the clip elements, wherein the clip elements provide locking projections, which engage with corresponding indentations provided in the cover plates in the form of beading strips. This prevents an accidental release of the clip elements, which are under spring tension.

Furthermore, the clip elements provide a surface, which is arranged in the region of the external periphery of the base frame after fitting the clip elements, and is formed on the at least one guide element. This guide element co-operates with a corresponding guide element formed on the measuring device to form a guide device.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Figure 1:
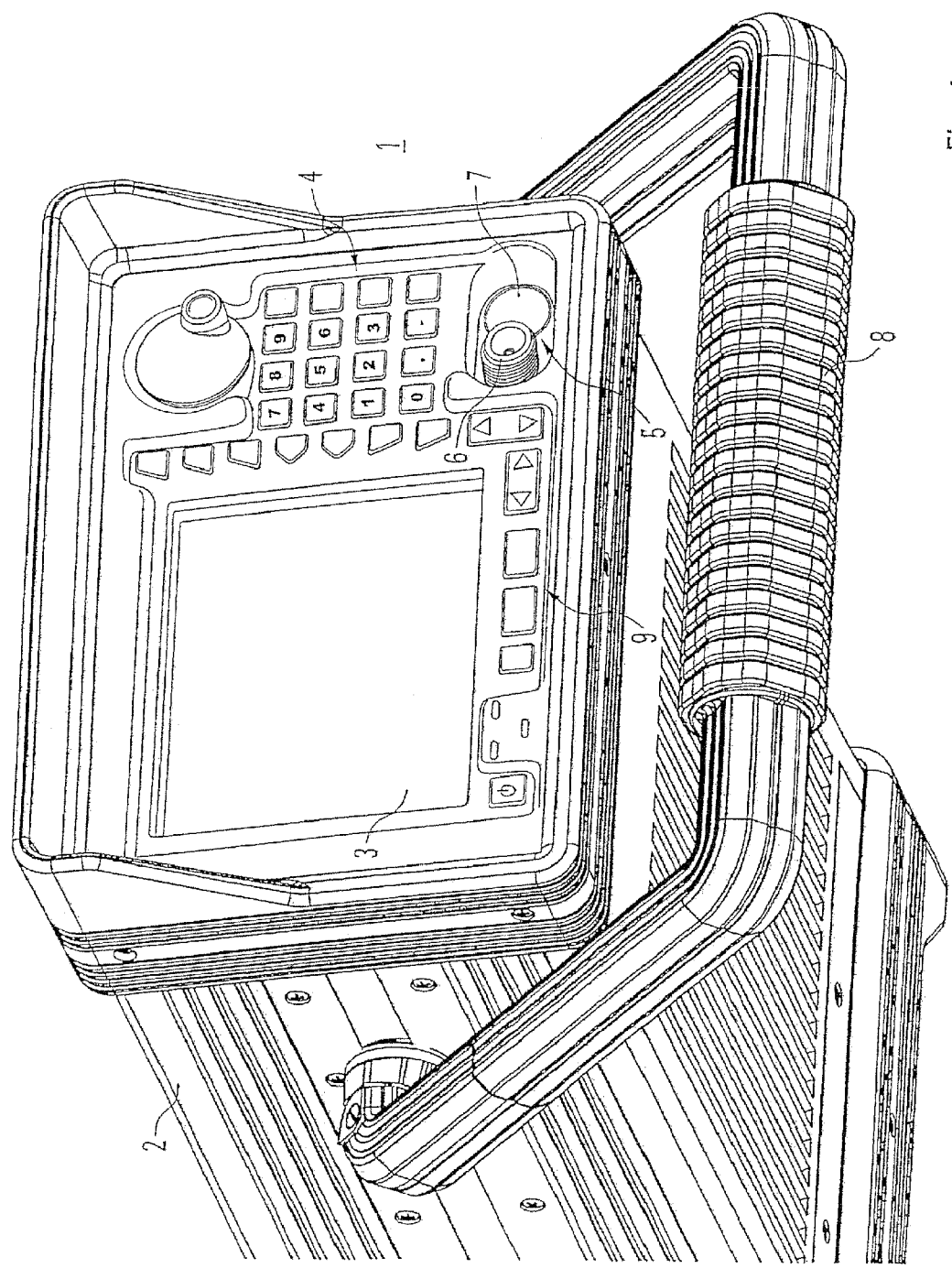
FIG. 1 shows a schematic presentation of a view of the front of the measuring device according to the invention.

An exemplary embodiment of a measuring device according to the invention is illustrated in FIG. 1. The measuring device 1 according to the invention comprises a measuring-device housing, at the front of which an information-output device 9 is arranged. A display device 3 is integrated in the information-output device 9. Furthermore, to operate the measuring device 1, several operating elements 4, which can be used to adjust various parameters for the implementation of a measurement or to call up different functions, are arranged in the information-output device 9 in the area on the front of the measuring device not required for the display device 3. A recess 5, through which an electrical connection 6 is accessible, is also provided at the front of the measuring device 1.

As will be described in greater detail below, the electrical connection 6 is arranged on a measuring-device module, which can be plugged into the measuring device 1 and, after assembly of the measuring-device module, projects through the recess 5 at the front of the measuring device 1. In the exemplary embodiment of the measuring device 1 according to the invention, the recess 5 is large enough to create an access to a second electrical connection, which can be provided for a further measuring-device module plugged into the device. In the exemplary embodiment presented, the corresponding opening in the front panel of the measuring device 1 can be closed with a blank cover 7.

Furthermore, a handle 8, which can be fixed to the lateral surfaces of the measuring device 1 via a clip device in a rail, is arranged on the measuring device housing 2. The handle 8 can be fixed via the clip device in almost any position required, so that it also acts as a support for the measuring device 1, by means of which the inclination of the measuring device can be adjusted.

Figure 2:
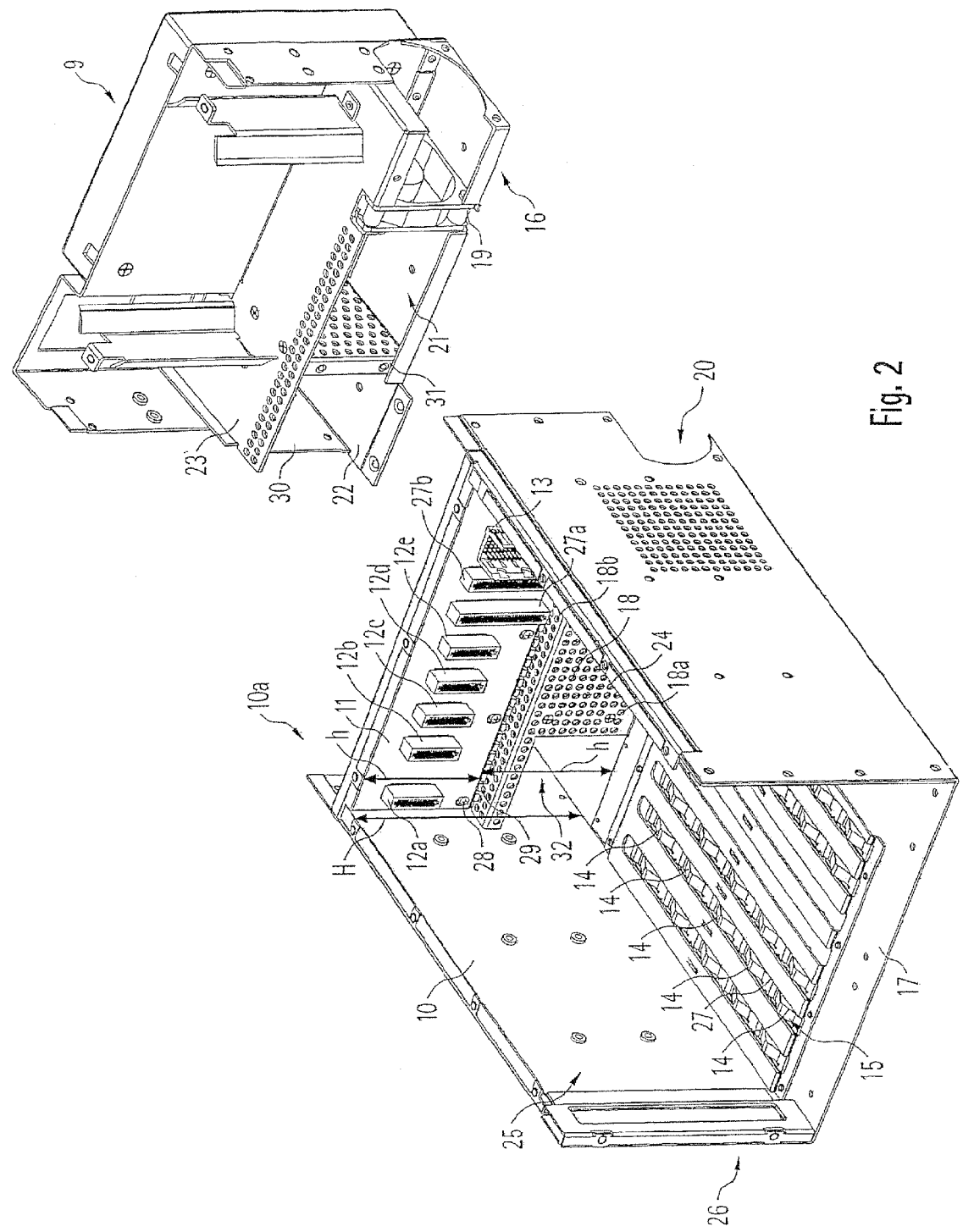
FIG. 2 shows a perspective presentation of a receiving device of the measuring device.

FIG. 2 shows the interior of the measuring device 1. The information-output device 9 arranged at the front of the measuring-device housing has been removed to allow a better view. Within the measuring-device housing 2, a receiving device 10 is arranged, at the front 10a of which the information-output device 9 is attached. In this context, the information-output device 9 is screwed to an operating-panel carrier 16 and is fixed together with the latter to the receiving device 10. By means of the operating-panel carrier 16, the information-output device 9 is arranged at a distance from a plug-and-socket panel 11, which, in the exemplary embodiment shown, is arranged in the receiving device 10 parallel to the front of the measuring device 1.

The height h of the plug-and-socket panel 11 is significantly smaller than the overall structural height H of the receiving device 10. The plug-and-socket panel 11 is arranged in an upper region of the receiving device 10. By way of extension of the plug-and-socket panel 11, an air-guide plate 18 is arranged toward the base 17 of the receiving device 10. Together with the plug-and-socket panel 11, the air-guide plate 18 separates the entire structural volume of the measuring device housing 2 into a front and a rear region.

A fan 19 is arranged in a lower region of the operating-panel carrier 16, which pumps ambient air via a cooling-air inlet 28, which is provided in a lateral wall of the measuring device 1, into a cooling-air shaft 21 to cool the electronic components of the measuring device 1. The cooling-air shaft 21 is limited at the lower side of the housing by a base plate 22 of the operating-panel carrier 16 and at the upper side by an intermediate plate 23. The intermediate plate 23 is disposed at the height of the transition between the plug-and-socket panel 11 and the air-guide plate 18.

The air-guide plate 18 provides a plurality of openings 24, by means of which the cooling-air shaft 21 is connected to a module region 25 in the rear portion of the receiving device 10. The air drawn by means of the fan 19 from the environment around the measuring device 1 accumulates in the cooling-air shaft 21. The pressure is balanced via the openings 24 in the direction of the module region 25, so that the module region 25 is regularly supplied with fresh cooling air. The electronic components of the measuring-device modules arranged in the module region 25 are cooled by the flow of cooling air. To achieve an air flow for cooling the measuring-device module not only in the lower region of the measuring device 1, the air-guide plate 18 is designed in an angled manner, thereby forming a vertical portion 18a and a horizontal portion 18b. The cooling air is then deflected over the horizontal portion 18b from the cooling-air shaft 21 into the region of the plug-and-socket panel 11.

The cooling-air shaft is limited in the direction towards one side wall 30 of the operating-panel carrier 16 by a perforated plate 31, in order to provide an accessible electrical connection, at least for some of the measuring-device modules fitted, which is also accessible from the information-output device 9. Between the side wall 30 and the perforated plate 31, the air-guide plate 18 is cut away appropriately creating a through opening 32, through which, as already explained, the electrical connections of the measuring-device module accessible from the front of the measuring device can be plugged.

A guide device 15 is formed on the base 17 of the receiving device 10 for each of the plug-in measuring-device modules, into which an individual measuring-device module can be introduced from the open, rear side 26 of the receiving device 10. This guide device 15 comprises a groove 27, which achieves the lateral guiding of a measuring-device module. Furthermore, the guide device 15 comprises several resilient tongues 14, which are arranged in the groove 27. The resilient tongues 14 hold the inserted measuring-device module at a defined distance from the base 17 of the receiving device 10. If a force acts upon the inserted measuring-device module, for example, when the measuring device is placed on a table, then the resilient tongues 14 are subjected to resilient deformation and the impact on the measuring-device module is therefore reduced. The guide components 15 of the receiving device co-operate with guide elements, which are arranged on the measuring-device modules and will be described below, in guiding the measuring-device modules.

For the exchange of data, each inserted measuring-device module is connected to a plug-and-socket panel 11 via one plug-in connection, several plug sockets 12a to 12e being provided on the plug-and-socket panel 11 for this purpose. In addition to this number of plug sockets 12a to 12e, further plug sockets 27a to 27b can also be provided on the plug-and-socket panel 11, which are used, for example, for connecting a computer module. The plug sockets 12a to 12e and the further plug sockets 27a, 27b are components of a bus system which is formed on the plug-and-socket panel 11.

This bus system is controlled via a computer module, which is also plugged into the receiving device 10. The distance between the plug sockets is determined by the grid dimension, according to which the guide devices are designed; by way of deviation from this, the plug sockets 12a and 12b have a wider spacing to allow the implementation of electrical connections at the front of the measuring device 1.

The measuring-device modules do not have their own power supply, but are supplied with electrical energy from a common current and voltage supply via the bus system formed on the plug-and-socket panel 11. For this purpose, a further plug element 13 is formed on the plug-and-socket panel 11 by means of which the plug-and-socket panel 11 is connected to a power pack, which is not shown in FIG. 2. Via the plug-and-socket panel 11, the power pack therefore supplies the necessary electrical energy for all the electrical and electronic components arranged in the measuring device 1, including the information-output device 9.

Communication between an input/output device and/or the information-output device 9 connected to the measuring device 1 and the individual measuring-device modules takes place exclusively via the bus system formed on the plug-and-socket panel 11. By preference, a USB (Universal Serial Bus) system can be used in this context. The plug-and-socket panel 11 is mounted in a floating manner within the receiving device 10. Screws 28, which are screwed through an extended recess in the plug-and-socket panel 11 to a component mounted on the receiving device 10, but concealed in the diagram by the plug-and-socket panel 11, are used to fix the plug-and-socket panel 11. Within certain limits defined by the extended recess, the plug-and-socket panel 11 can be displaced relative to the receiving device 10. The plug-and-socket panel 11 is also held by a clamping strip 29. The clamping strip 29 consists of a number of spring clips, which additionally fix the plug-and-socket panel 11 and, via the clamping force, prevent the plug-and-socket panel 11 from being displaced too readily. The friction caused by a displacement damps the movement of the plug-and-socket panel 11 and, therefore, also of the measuring-device modules plugged into it.

If the measuring-device module is displaced relative to the receiving device 10 on the basis of the guide device 15, then the plug-and-socket panel 11, which is connected to the measuring-device module via the relevant plug socket 12a to 12e and/or via the other plug sockets 27a, 27b, can follow the movement of the fitted measuring-device modules. Accordingly, the plug-and-socket panel 11 experiences friction at the clamping strip 29, thereby damping the movement of the inserted measuring-device modules.

The guide device 15 is preferably structured in a symmetrical manner so that appropriately designed resilient tongues 14 and grooves 27 are introduced, respectively, into the cover of the receiving device 10, which is not illustrated in FIG. 2. In total, ten plug positions are provided in the receiving device 10, of which five are provided for receiving the measuring-device modules, two plug positions being provided for a computer module and the other three plug positions being reserved for a power pack. A guide device 15 with resilient tongues 14 is not provided in the region with the power pack. The individual measuring-device modules can be built up with different widths, so that several plug positions may be occupied by a single measuring-device module.

Figure 3:
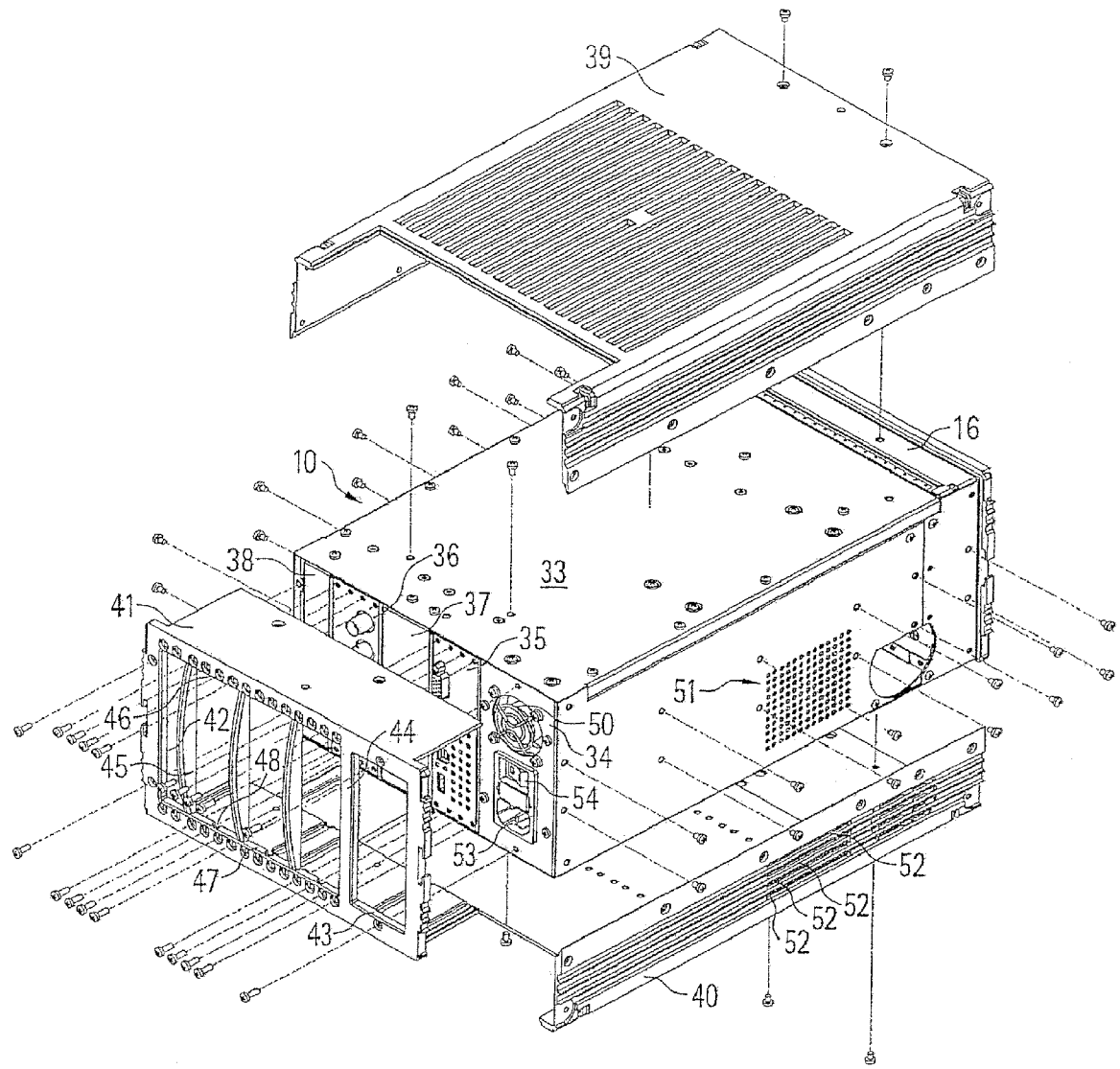
FIG. 3 shows a perspective presentation of the receiving device with housing components removed.

FIG. 3 once again illustrates the receiving device 10 but, in this diagram, the cover 33 is also fitted. Moreover, the operating-panel carrier 16 is attached to the receiving device 10. The receiving device 10 is fitted, for example, with a power pack 34 and two measuring-device modules 35 and 36, the measuring-device module 35 being designed as a computer module. The space remaining at the rear of the receiving device 10 between the measuring-device modules 35 and 36 is occupied by unapertured-face blank elements 37 and 38. Accordingly, the power pack 34, the measuring-device modules 35 and 36, and the blank elements 37 and 38 fully occupy the rear of the receiving device 10. The blank elements 37 and 38 contact the measuring-device modules 35 and 36 or, respectively, the lateral wall of the receiving device 10 with lamellae, which will be described in greater detail below and which contributes to a screening of the measuring-device modules from electromagnetic radiation.

In order to achieve a unified visual appearance and a robust housing for the measuring device 1, an upper housing part 39 is placed onto the receiving device 10, which, together with a lower housing part 40, forms the visible, external measuring-device housing 2 of the measuring device 1. The measuring-device modules 35 and 36 and the power pack 34 are fixed in the receiving device 10, into which the measuring-device modules are initially only inserted, by means of a rear cover 41 of the measuring-device housing. The rear cover 41 of the measuring-device housing provides an opening 42, through which the sides of the measuring-device modules 35 and 36 facing towards the rear of the receiving device 10 and the power pack 34 are accessible. A second opening 43, which is separated from the opening 42 for the measuring-device modules 35 and 36 by a Web 44, is provided for the power pack 34.

In order to cover the visible transitions between the measuring-device modules 35 and 36 and the blank elements 37 and 38, insertion elements 45 are inserted in the rear cover 41 of the measuring-device housing. For this purpose, receiving recesses 48 are formed at an upper edge 46 and a lower edge 47 of the opening 42, into which the insertion elements 45 are inserted. The gaps which occur between the measuring-device modules 35 and 36 and the blank elements 37 and 38 are covered by the insertion elements 45, so that when the rear cover 41 is in place, a visually unified overall impression of the measuring device 1 is formed.

By contrast with the other measuring-device modules, the power pack 34 has its own cooler. For this purpose, a fan 50 is attached at the rear side of the power pack 34, which causes a flow of cooling air through the interior of the power pack 34, lateral inlet openings 51 being provided for the flow of cooling air. The inlet openings 51 are arranged in a lateral wall of the receiving device 10. Slots 52 are formed at a corresponding position in the lower part of the housing.

Furthermore, a power connection 53 is provided at the rear wall of the power pack 34, by means of which the measuring device 1 can be connected to a power cable. A main switch 54 is provided in order to switch the measuring device 1 on and off. This main switch 54 is used for the complete isolation of the device. For a normal operational interruption, the measuring device 1 can be switched on and off via a standby switch arranged on the front panel.

FIG. 4 once again shows the receiving device 10, wherein the measuring-device modules 35 and 36 are shown withdrawn from the measuring device. Each of the measuring-device modules 35 and 36 is connected via a contact strip 55 or 56, respectively, to one of the plug sockets 12a to 12e or 27a or 27b respectively. At the side of the measuring-device module 36 opposite to the contact strip 56 of the measuring-device module 36, which faces towards the rear of the measuring device, electrical contacts 57, 57', and 57" are formed, which can be input or output contacts for each of the relevant measuring-device modules. The measuring-device module 36 is provided for processing measurement signals, which originate from the device under test (DUT). The devices to be tested may be connected, for example, to one of the connections 57, 57', or 57". A measurement signal of this kind is processed entirely within the measuring-device module 36. The parameters, which are required for processing an incoming signal of this kind, are supplied to the measuring-device module 36 via the bus system of the plug-and-socket panel 11 and the contact strip 56.

Testing a device in this manner leads to the output of a data record from the measuring-device module 36, the data record being made available via the contact strip 56 through the measuring-device module 36 and the bus system of the plug-and-socket panel 11, to other measuring devices or to the information-output device 9 for display. In the exemplary embodiment presented, as already described with reference to FIG. 1, the connection 6, which is accessible from the front of the measuring device 1, is formed on the measuring-device module 36 in addition to the electrical connections 57, 57', 57" at the rear of the measuring device 1. Both the electrical connection 6 and also the electrical connections 57, 57', and 57" are used for the input and output of signals, which are required for the measurement, including, for example, trigger signals, wherein the processing of a measured signal takes place exclusively within the measuring-device module. The data record determined in this manner can be further processed in other measuring-device modules or external computer units or can be presented via a display device.

By contrast, the measuring-device module 35 is designed as a computer module and is connected via the contact strip 55 to the information-output device 9. This computer module controls the USB bus used jointly by the measuring-device module 36 and the computer module. At the side facing towards the rear of the measuring device 1, a connection 58 is provided on the measuring-device module 35, inter alia, for an additional monitor device.

On the blank element 37 arranged between the measuring-device module 35 and the measuring-device module 36, lamellae 59 are formed on both sides facing the measuring-device modules 35 and 36, which are in contact with the measuring-device modules 35 and 36 in the rear region of the measuring-device modules 35 and 36, when the measuring-device modules 35 and 36 are plugged into the measuring device 1. The lamellae 59 are manufactured from a conductive material, so that they contribute to the screening of the measuring-device modules 35 and 36 arranged in the receiving device 10. Lamellae, which achieve a screening of electromagnetic radiation, are also formed on both sides of the blank element 38 arranged between the measuring-device module 36 and the lateral wall of the receiving device 10. These lamellae 59 of the blank elements 37 and 38 co-operate with corresponding lamellae, formed on each measuring-device module 35 and 36, respectively, which will be explained in greater detail in connection with the structure of the measuring-device modules 35 and 36. The lamellae are designed in the farm of flat metal clips, which can be subjected to resilient deformation and therefore achieve a secure contact with the adjacent structural component.

Figure 5:
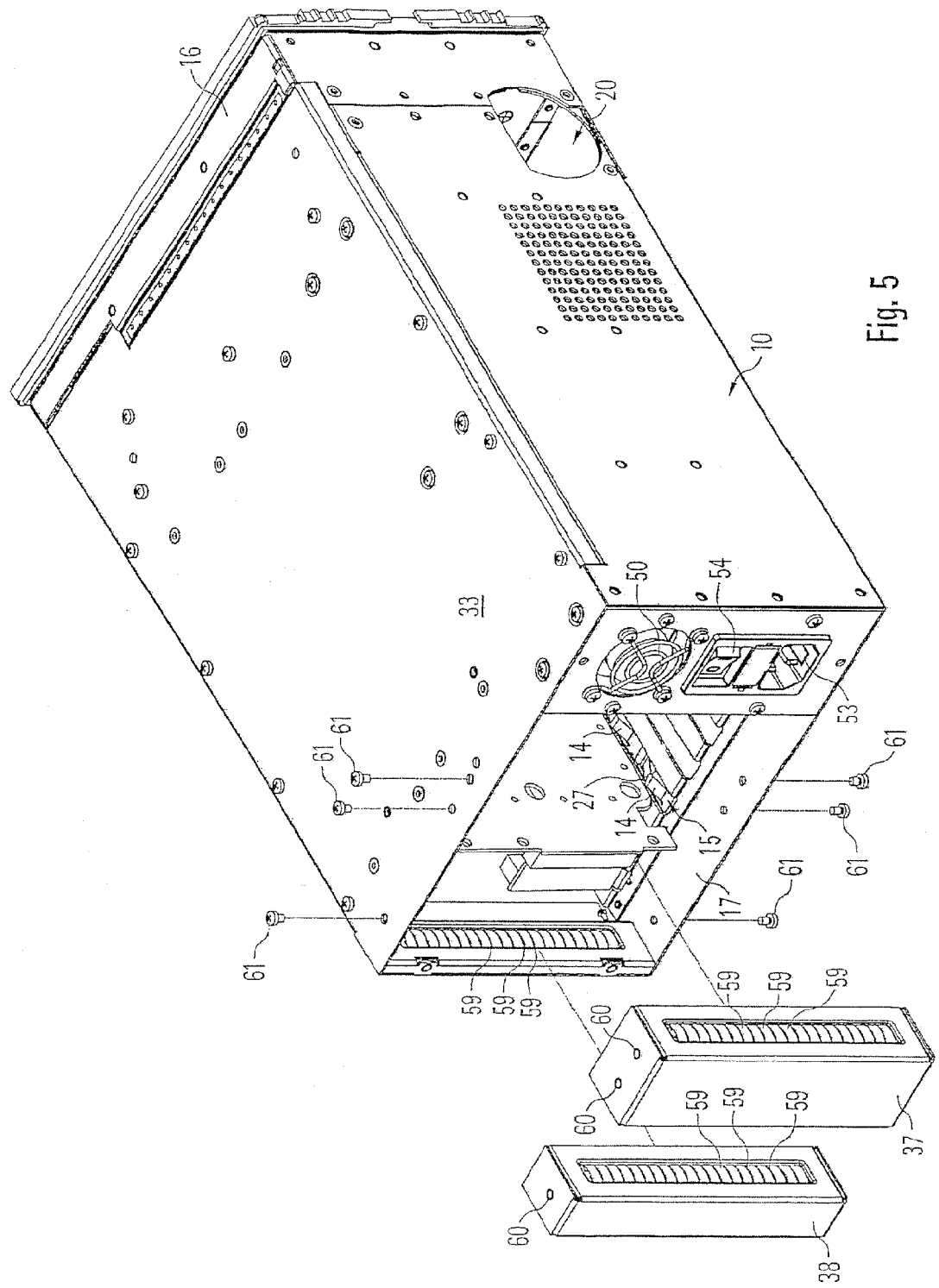
FIG. 5 shows a perspective presentation of the receiving device with the blank elements removed.

FIG. 5 once again shows the receiving device 10, with the blank elements 37 and 38 removed. Threaded boreholes 60 to the base 17 of the receiving device and to the cover 33 are provided in the blank elements 37 and 38, so that the blank elements 37 and 38 can be screwed to the cover 33 and/or the base 17 of the receiving device 10. For this purpose, screws 61 are screwed through the base 17 of the receiving device 10 and the cover 33 into the corresponding threaded boreholes 60.

Figure 6:
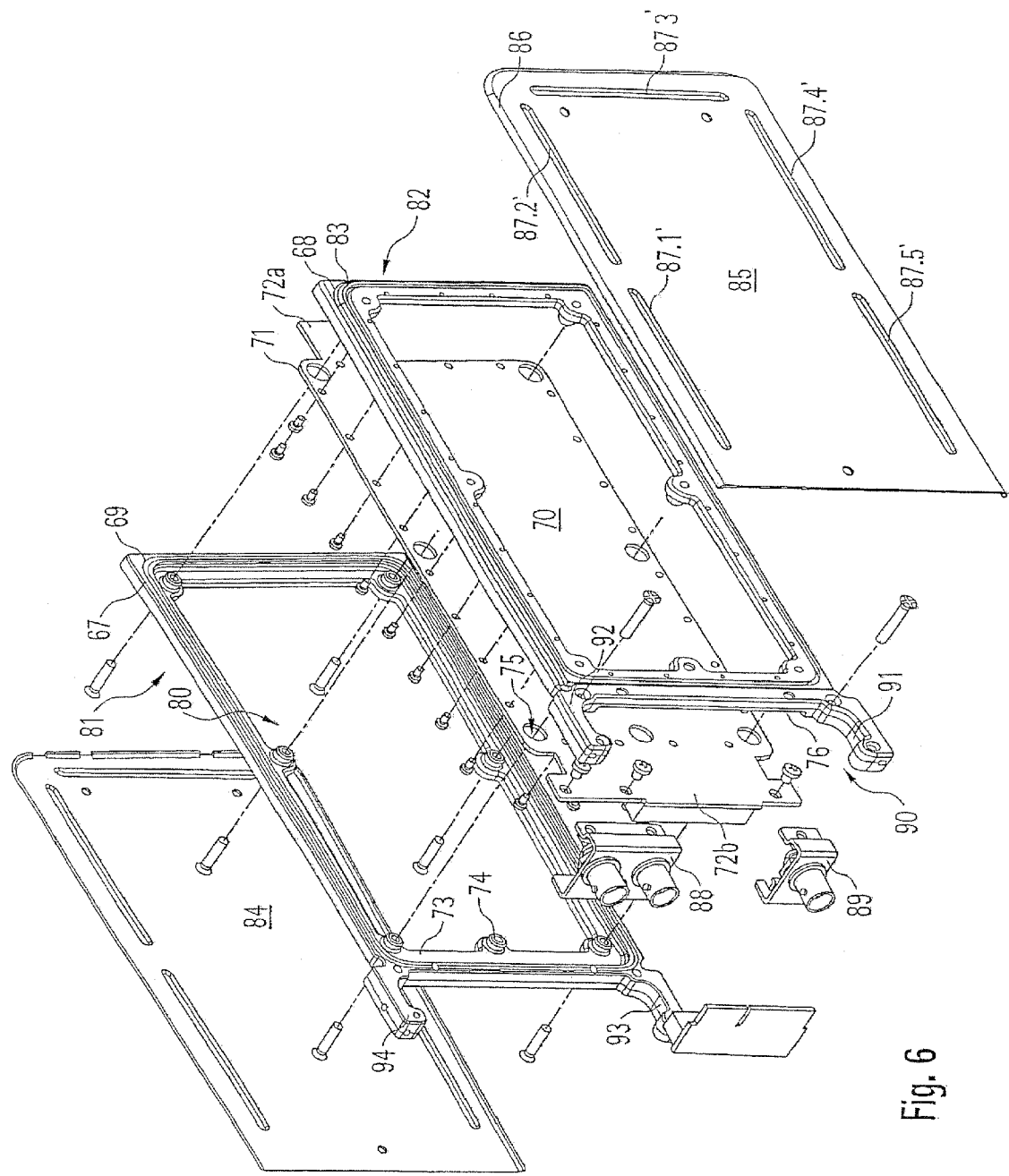
FIG. 6 shows a schematic presentation of the structure of a first measuring-device module according to the invention.

FIG. 6 shows a first exemplary embodiment of the structure of a measuring-device module according to the invention. A first frame element 67 and a second frame element 68 act as bearing components of the measuring-device module. The two frame elements 67 and 68 are essentially rectangular, the first frame element 67 providing a groove 69 at its side facing towards the second frame element 68, into which a high frequency sealing thread is inserted. The first frame element 67 and the second frame element 68 can be connected to one another along this groove 69 so that an enclosed base frame is formed along the groove 69 consisting of the first frame element 67 and the second frame element 68. A main printed-circuit board 70 is mounted in this base frame.

To accommodate the main printed-circuit board 70, the first frame element 67 provides a mounting element 73 arranged on the inner periphery of the frame element 67, onto which the main printed-circuit board 70 is placed.

Centering elements 74 are preferably attached to the mounting element 73, which determine the position of the main printed-circuit board 70 relative to the first frame element 67. These centering elements 74 are preferably designed to be cylindrical in shape with multiple steps, and engage with at least one step in corresponding centering recesses 75 in the main printed-circuit board.

Furthermore, a first projection 72a and a second projection 72b are formed on the main printed-circuit board 70, which project beyond the first printed-circuit-board space 80 formed within the peripheral groove 69. To allow the passage of the second projection 72b, a milled recess 76 is provided in the second frame element 68, which leaves free a slot slightly wider than the thickness of the main printed-circuit board 70 between the two frame elements 67 and 68, when the first frame element 67 and the second frame element 68 are joined together. A corresponding milled recess, which is not shown in the diagram, is formed on the second frame element 68 for the first projection 72a. The projection 72a passes through the milled recess and forms the contact strip 55.

The first frame element 67 and the second frame element 68 combine to form a base frame, in which the main printed-circuit board 70 is clamped. The first frame element 67 and the second frame element 68 fix the printed-circuit board 70 along the external periphery of the main printed-circuit board 70. The majority of the area of the main printed-circuit board 70 is not covered by the frame elements 67 and 68. The base frame produced in this manner provides a raised periphery 83 at each of its sides 81 and 82 facing away from one another, which is used for fixing cover plates 84 and 85 onto the base frame.

The cover plates 84 and 85 enclose the base frame and accordingly form an enclosed first printed-circuit-board space 68, in which the majority of the main printed-circuit board 70 is arranged. Since the cover plates 84 and 85 and also the first frame element 67 and the second frame element 68 are manufactured from a metallic material, the components arranged in the interior are shielded from electromagnetic radiation. The cover plates 84 and 85 are identical in structure, and the description below is therefore limited to the cover plate 85 illustrated in the foreground.

At its edge 86, the cover plate 85 provides an approximately 90° fold in the direction towards the second frame element 68. In its exterior contour, the fold corresponds to the raised periphery 83 of the second frame element 68. Like the raised periphery 83, the fold on the outer edge 86 extends around three sides of the rectangular geometry of the base. Parallel to the fold on the edge 86 of the cover plate 85, there are several beading strips 87.1 to 87.5 introduced into the cover plate 85, wherein the beading strips 87.1 to 87.5 are also orientated as indentations in the direction towards the fold at the edge 86 of the cover plate 85.

A first connection element 88 and a second connection element 89 for connecting the main printed-circuit board 70 are arranged on the second projection 72b projecting from the first printed-circuit-board space 80. The second projection 72b extends through the milled recess 76 from the first printed-circuit-board space 80 into a second printed-circuitboard space 90. The second printed-circuit-board 90 is enclosed by frame arms 91 to 94 provided on the first frame element 67 and the second frame element 68. When the first frame element 67 is connected to the second frame element 68, the mutually facing surfaces of the frame arms 91 to 94 are therefore once again in flush contact with one another.

The base frame consisting of the first frame element 67 and the second frame element 68 therefore forms a first printed-circuit-board space 80 and a second printed-circuit-board space 90, wherein the first printed-circuit-board space 80 is enclosed at both sides of the main printed-circuit board 70 by a cover plate 84 and 85, respectively. A second projection 72b of the main printed-circuit board 70 projects into the second printed-circuit-board space 90. To allow the passage of the main printed-circuit board 70 into the second printed-circuit-board space 90, a milled recess 76, by means of which the first printed-circuit-board space 80 is connected to the second printed-circuit-board space 90, is provided. In the exemplary embodiment illustrated, a connection element 88 and a second connection element 89 in the second printed-circuit-board space 90 are connected to the printed conductors of the main printed-circuit board 70. A milled recess is also provided on the opposite short side of the measuring-device module, through which the first projection 72a projects from the first printed-circuit-board space 80, the projection 72a being formed as a contact strip, which can be plugged into one of the plug sockets 12a to 12e or, respectively, 27a or 27b.

Figure 7:
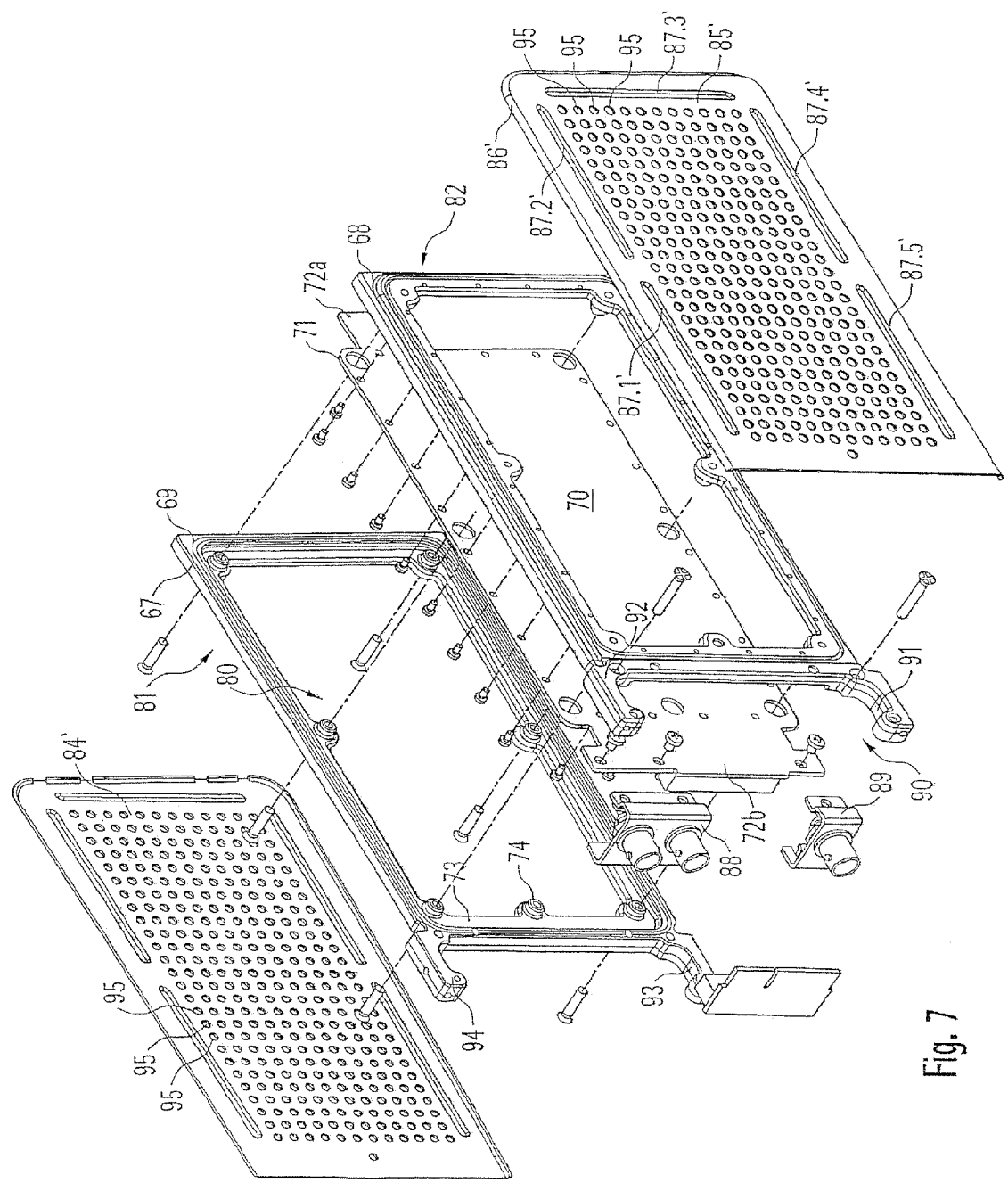
FIG. 7 shows a schematic presentation of the structure of a second measuring-device module according to the invention.

The measuring-device module shown in FIG. 7 essentially corresponds in its structure to the measuring-device module shown in FIG. 6. However, instead of the cover plates 84 and 85, cover plates 84' and 85', which are perforated with cooling-air apertures 95 to achieve improved cooling of the electronic components arranged on the main printed-circuit board 70, are provided. To ensure continued, adequate screening, metallic covers, which prevent electromagnetic interference are attached to the main printed-circuit board.

Figure 8:
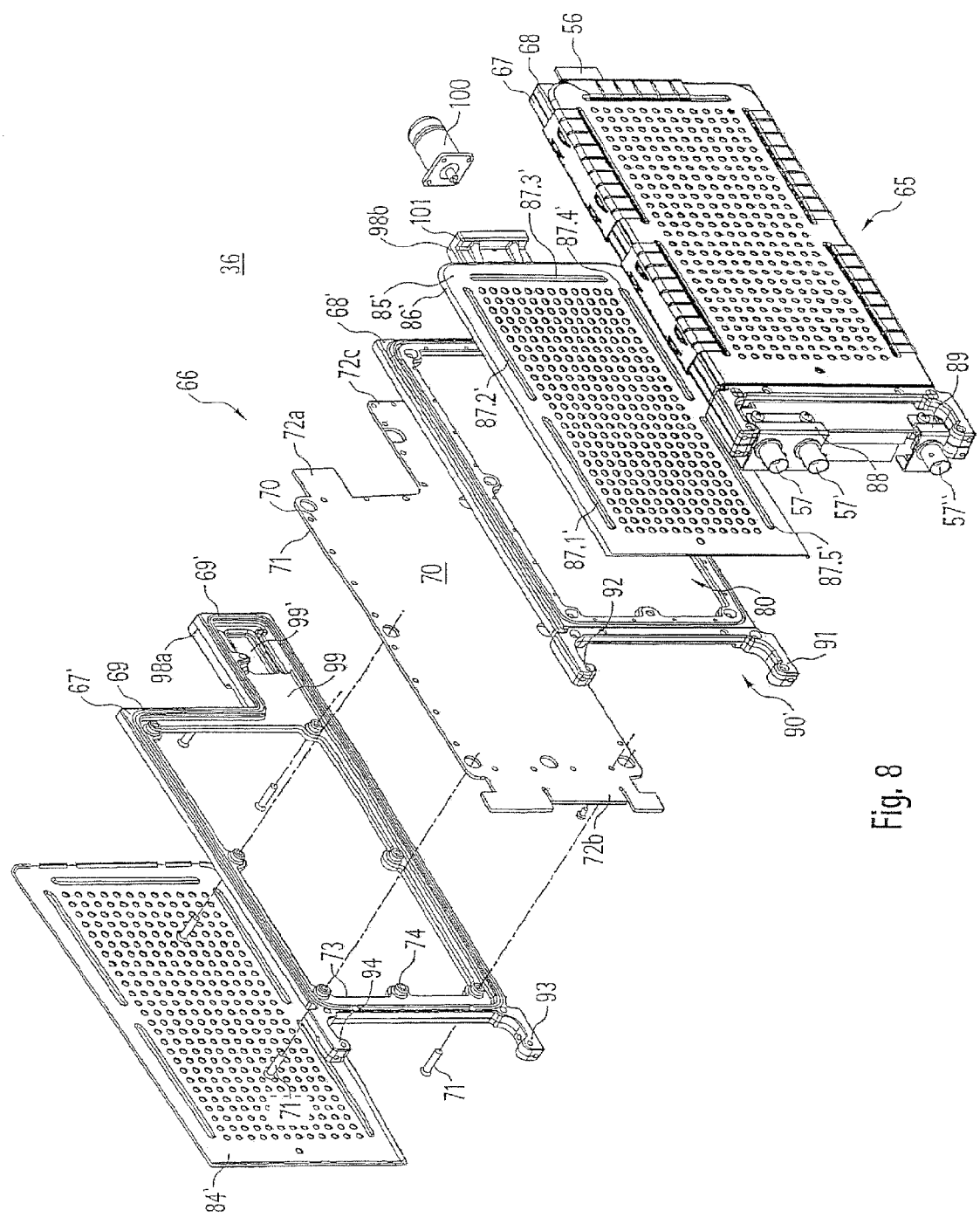
FIG. 8 shows a schematic presentation of the structure of a first measuring-device module according to the invention consisting of two base elements.

FIG. 8 shows a further advantageous embodiment of a measuring-device module 36 according to the invention. In this embodiment, the main printed-circuit board 70 has a third projection 72c. Corresponding to the geometric extension of the third projection 72c, a connection carrier 98 is formed on the first frame element 67' and the second frame element 68'. For this purpose, a first connection-carrier element 98a is formed on the first frame element 67'. Along the outer edge of the first frame element 67', a peripheral groove 69' is once again formed, which also runs along the outer contour of the first connection-carrier element 98a. Furthermore, an enclosed base surface 99 is formed in the region of the first connection-carrier element 68a on the side of the frame element 67' facing towards the cover plate 84'.

On the second frame element 68', corresponding to the first connection-carrier element 98a, a second connection-carrier element 98b is provided, which also has a base surface, which is not visible in the diagram, so that the third projection 72c of the main printed-circuit board 70 is enclosed, when the first frame element 67' and the second frame element 68 are combined to form a base frame. While an extremely small gap for the passage of the third projection 72c is formed in the transitional region between the first printed-circuit-board space 80 and the connection carrier 98, an enlarged free space 99' is formed by a gradation of the base surface 99 at the end of the connection carrier 98 facing away from the first printed-circuit-board space in which sufficient space is available to provide a connection of the main printed-circuit board 70 to the third projection 72c by an electrical connection 100.

The electrical connection 100 is screwed onto the end face of the connection carrier 98, an additional fastening surface 101 being formed on the second connection-carrier element 98b in the exemplary embodiment illustrated. In dependence upon the installation position of the corresponding measuring device module within the measuring device 1, the additional fastening surface 101 may also be formed on the first connection-carrier element 98a.

Figure 4:
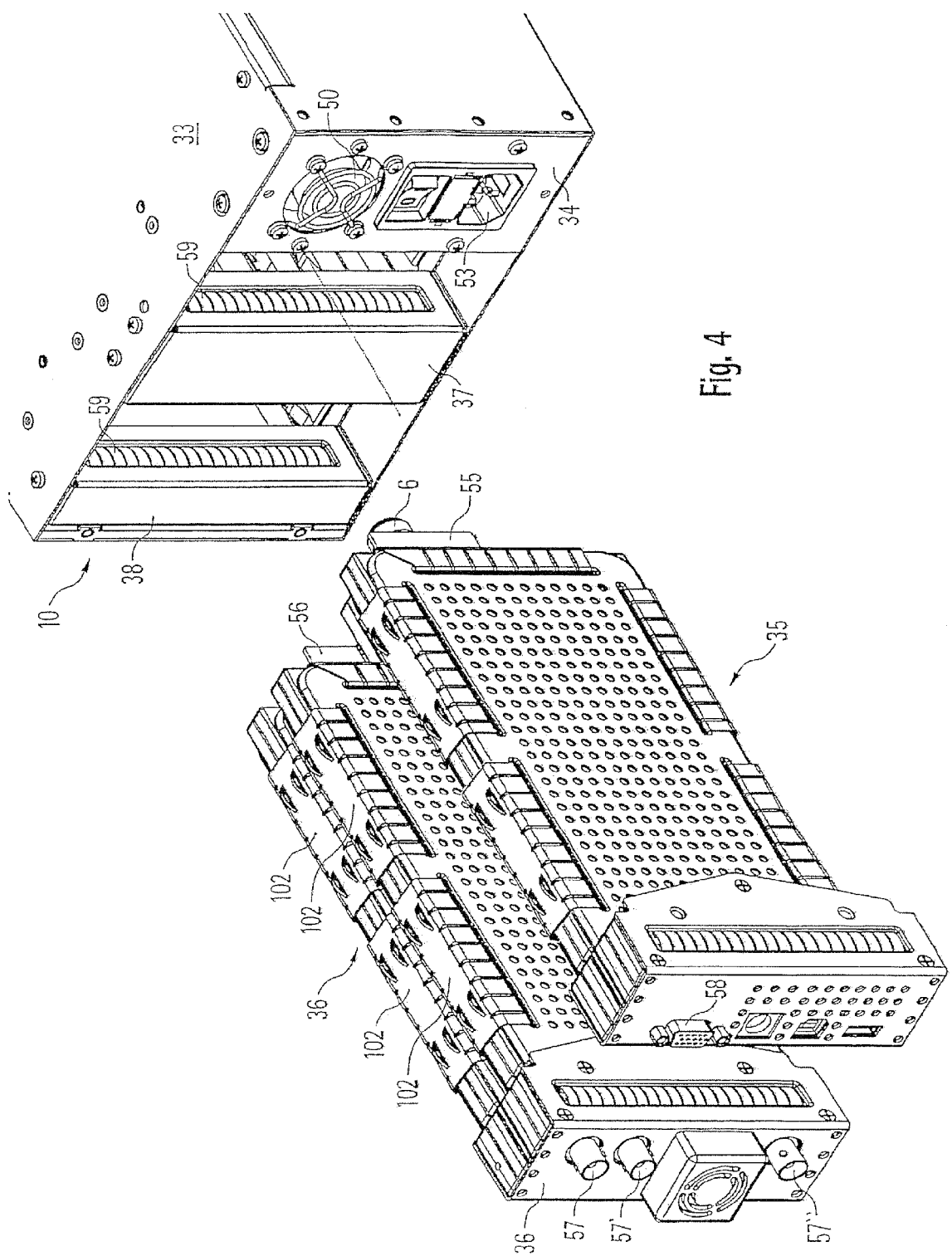
FIG. 4 shows a perspective presentation of the receiving device with the measuring-device modules removed.

FIG. 8 illustrates the measuring-device module 36, as shown in FIG. 4. The measuring-device module is composed of two base elements 65 and 66, the base element 65 corresponding to the base element described with reference to FIG. 7. The base element 66, which is connected to the base element 65 in the region of the frame arms 91 and 92, is additionally present. The frame arms 91 to 94 are thicker than the part of the first frame element 67' and the second frame element 68' enclosing the first printed-circuit-board space 80, so that the frame arms 91 and 92 can be brought into contact with the frame arms 93 and 94 of the base element 65. Together with the frame arms 91 to 94 of the base element 65, the frame arms 91 to 94 of the base element 66 therefore enclose a common structural space, which is described as the additional printed-circuit-board space 90'.

An additional printed-circuit board, which is not illustrated here, but which provides the connection of the main printed-circuit board 70 of the base element 66 to a further main printed-circuit board 70 of the base element 65 may, for example, be arranged in this additional printed-circuit-board space 90'.

Figure 9:
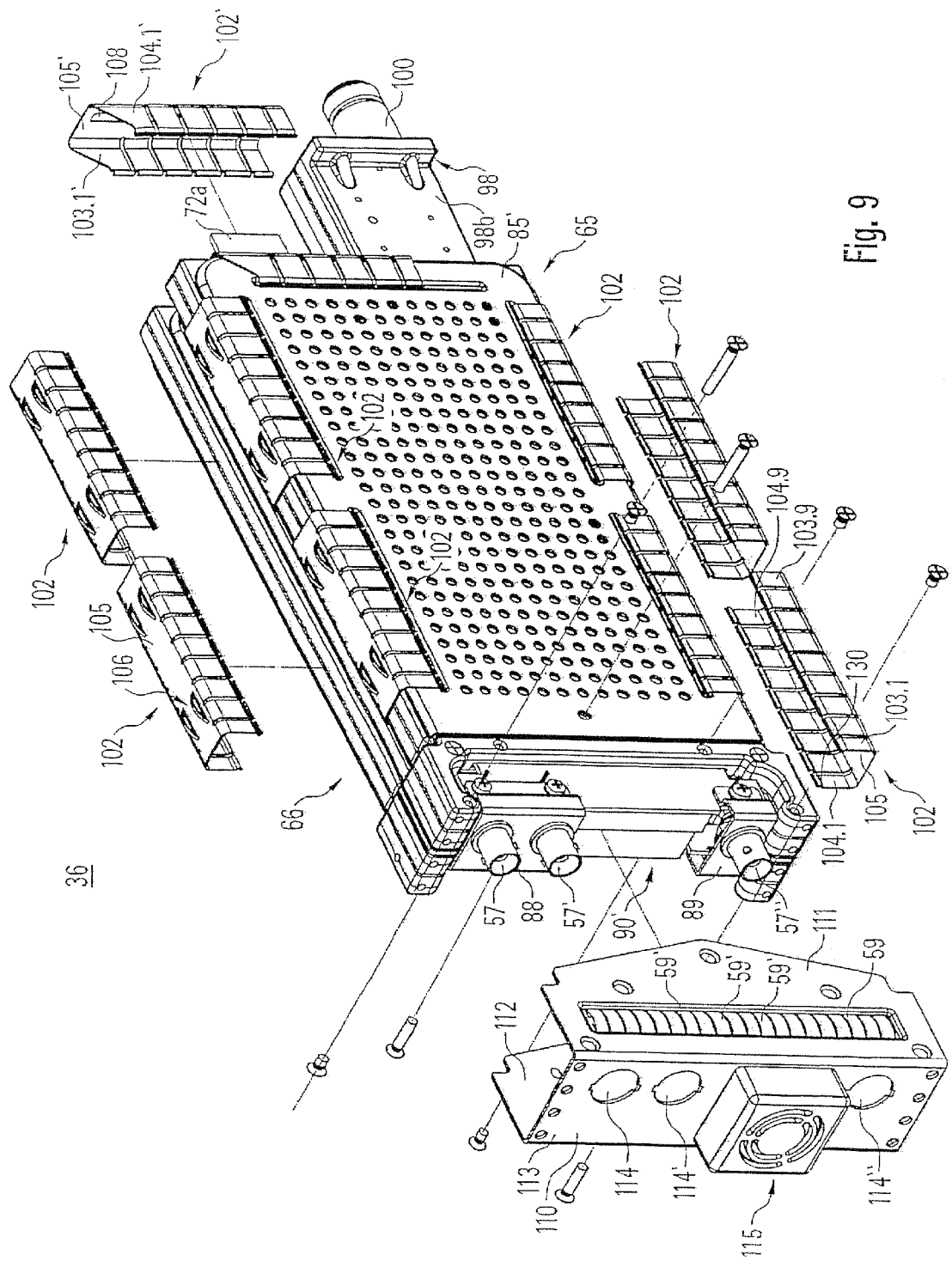
FIG. 9 shows a schematic presentation of the structure of a second measuring-device module according to the invention consisting of two base elements.

FIG. 9 once again shows the measuring-device module 36, with the two base elements 65 and 66 already combined. While the frame elements 67 and 68 or, respectively, 67' and 68' are screwed together, the cover plates 84' and 85' are merely placed in position. To prevent a displacement on the relevant base frame, the outer edges 86 of the cover plates are, as already described, folded in such a manner that they engage around a corresponding, raised periphery 83 formed on the relevant frame element 67, 68, 67', or 68'. Clip elements 102 are provided to fix the cover plates 84' and 85' to the base frame of the base elements 65 and 66.

The clip elements 102 are formed as a U-shaped profile, which extends along a length, which is at most equal to the length of the beading strips 87.1 to 87.5. In this context, the two arms of the U-profile are formed from a row of individual spring clips 103.1 to 103.9 or, respectively, on the opposite side, 104.1 to 104.9. The spring clips 103.1 to 103.9 and 104.1 to 104.9 are jointly arranged on a carrier surface 105. The width of this carrier surface 105 is determined by the width of the base frame.

In the opposite direction to the direction in which the spring clips 103.1 to 103.9 and 104.1 to 104.9 extend from the carrier surface 105, a pair of curved projections 106 is punched out of the carrier surface 105 to form a guide element. In this context, the distance between the mutually facing edges of the punched-out, curved projections 106 is slightly larger than the lateral extension of the resilient tongues 14. By contrast, the distance between the edges of the punched-out curved projections 106 facing away from one another corresponds to the width of the groove 27 in the receiving device 10. The punched-out, curved projections 106 arranged respectively in pairs on the carrier surface 105 of the clip elements 102 accordingly co-operate with the guide component 15 of the receiving device 10 to form a guide device for the respective measuring-device module.

The clip elements 102 are pushed from the external periphery over the cover plates 84' and 85' placed on the base frame until locking projections 107, which are arranged on each spring clip 103.1 to 103.9 and 104.1 to 104.9 at the end facing away from the carrier surface 105, snap into the beading strips 87.1 to 87.5. In this context, the length of the spring clips 103.1 to 103.9 and 104.1 to 104.9 is dimensioned in such a manner that the carrier surface 105 is in contact with the base frame. This guarantees that the force transferred from the resilient tongues 14 to the measuring-device module is actually transferred to the measuring-device module and does not merely lead to a displacement of the clip elements 102 on the base element.

A clip element 102', which has a slot 108 in its carrier surface 105', through which the projection 72a of the main printed-circuit board 70 passes, is also arranged at the end of a base element facing towards the front of the measuring device 1. Because of the connection carrier 98, the clip element 102' is shorter than the other clip elements 102. To continue to surround the slot 108 so that it is enclosed by the carrier surface 105', the respective first spring clips 103.1' and 104.1' are designed with a bevel.

On the opposite side of the measuring-device module 36, the open, additional printed-circuit-board space 90', in which the first connection element 88 and the second connection element 89 are screwed to the second projection 72b of the main printed-circuit board 70 of the base element 65, is covered by a housing cover 110. The housing cover 110 covers three sides of the additional printed-circuit-board space 90' formed by the frame arms 91 to 94 of the base element 65 and the frame arms 91 to 94 of the base element 66. The housing cover 110 has lateral cheeks 111 and 112, of which the extension in the direction towards the electrical connection 100 is greater than the length of the frame arms 91 to 94. Accordingly, the lateral cheek 111 overlaps the cover plate 85' and the lateral cheek 112 overlaps the cover plate 84'. Each of the cover plates 84' and 85' is then screwed, together with the lateral cheeks 111 and 112, respectively, to one of the frame elements. Accordingly, by means of the joint screw connection of the lateral cheeks 111 and 112 to the cover plates 84' and 85', respectively, contact with the relevant base element is ensured even in the region in which the cover plates 84' and 85' cannot be fixed with a clip element 102.

Furthermore, a region is provided in the lateral cheek 111, in which the lamellae 59, already mentioned with reference to the blank elements 37 and 38, are arranged. The lateral cheeks 111 and 112 are connected to one another via a rear wall 113, connection apertures 114, 114', and 114" being provided in the rear wall 113, through which the electrical connections 57, 57', and 57" project from the housing cover 110, when the housing cover 110 is placed onto the measuring-device module 36.

In the exemplary embodiment illustrated, a further fan 115 is provided in the housing cover 110, which is used to increase the air flow in the region of the base elements 65 and 66. A gap is provided between the mutually facing cover plate 85' of the base element 66 and the cover plate 84' of the base element 65, which allows a through flow of cooling air. To manufacture a gap of this kind, the size of which is determined by the grid dimension of the guide devices 15 in the receiving device 10, spacing elements are provided between the base elements 65 and 66 in the region of the frame arms 91 and 92 of the base element 66 and the frame arms 93 and 94 of the base element 65. These will be explained with reference to FIG. 10.

Figure 10:
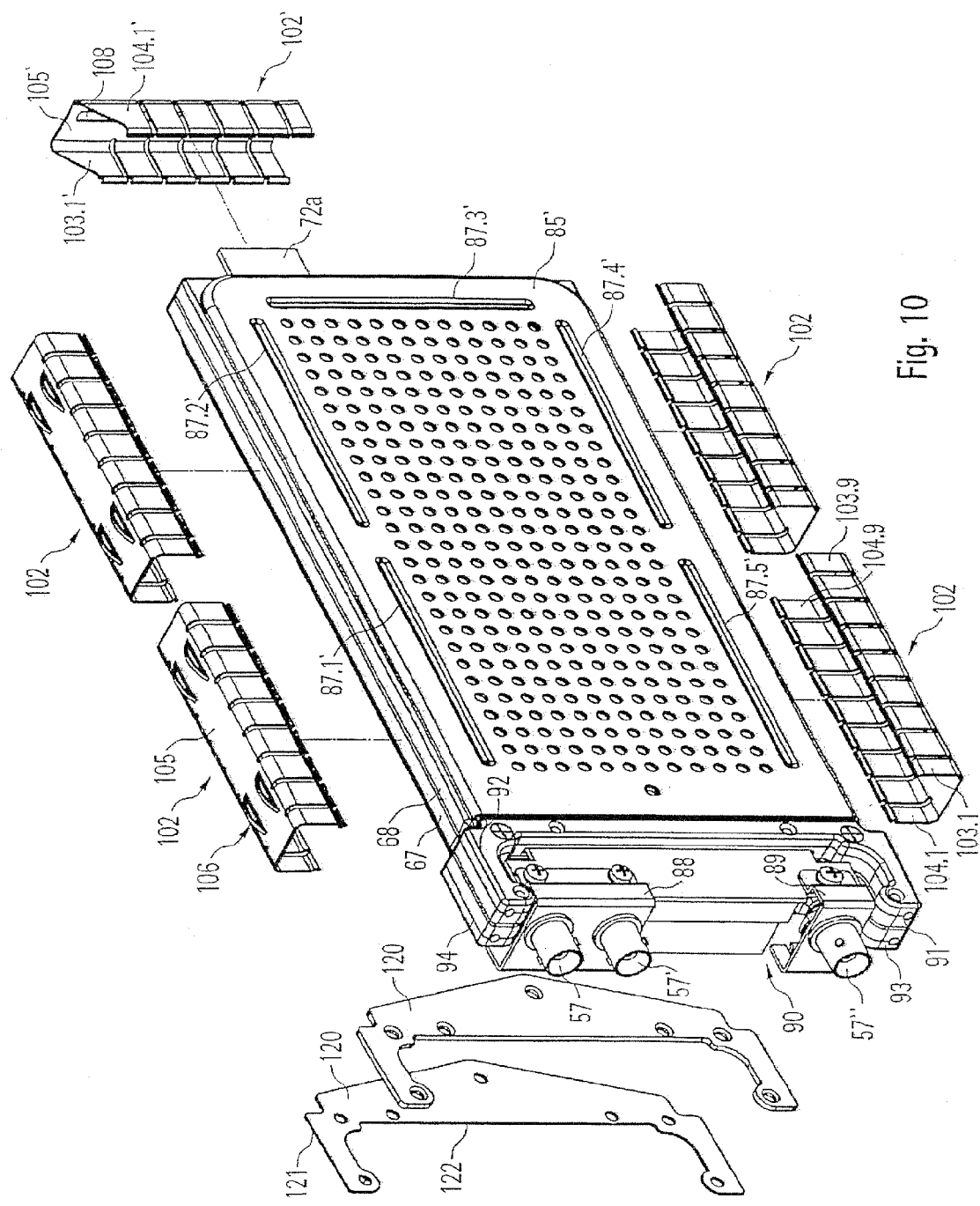
FIG. 10 shows a schematic presentation of the structure of a first measuring-device module according to the invention with spacing elements.

In the simplest case, a measuring-device module is represented by a single base element, as shown in FIG. 10. The grid dimension, in which the guide devices 15 are arranged within the receiver device 10, is determined by the structural width of a measuring-device module of this kind. As already mentioned in the explanation of the connection of more than one base element, with a base element of this kind, the maximum structural width is in the region of the frame arms 91 to 94.

The material thickness of the lateral cheeks 111 and 112 of the housing cover 110 is added to this structural width. If the measuring-device module is composed of two base elements, as in the case of the measuring-device module illustrated in FIG. 9, then the lateral cheeks 111 and 112, respectively, which are arranged between the frame arms 91 to 94 of two base elements, are dispensed with because of the common housing cover 110. Accordingly, if two base elements are combined to form a measuring-device module, then two spacing elements are inserted between the two base elements to ensure that the grid dimension is maintained.

In this context, the spacing elements 120 have an external contour 121, which corresponds with the external contour of the lateral cheeks 111 and 112, respectively. Accordingly, one part of the spacing elements 120 overlaps the corresponding cover plate 84' or 85', respectively, of the base elements 65 or 66, respectively, which are to be connected in such a manner that the corresponding cover plates 84' and 85, respectively are also fixed in the region of the transition between the first printed-circuit-board space 80 and the additional printed-circuit-board space 90'. Furthermore, the spacing elements 120 have an internal contour 122, which corresponds with the internal geometry of the second printed-circuit-board space 90 formed by the frame elements 67 and 68, together with the frame arms 91 to 94.

Figure 11:
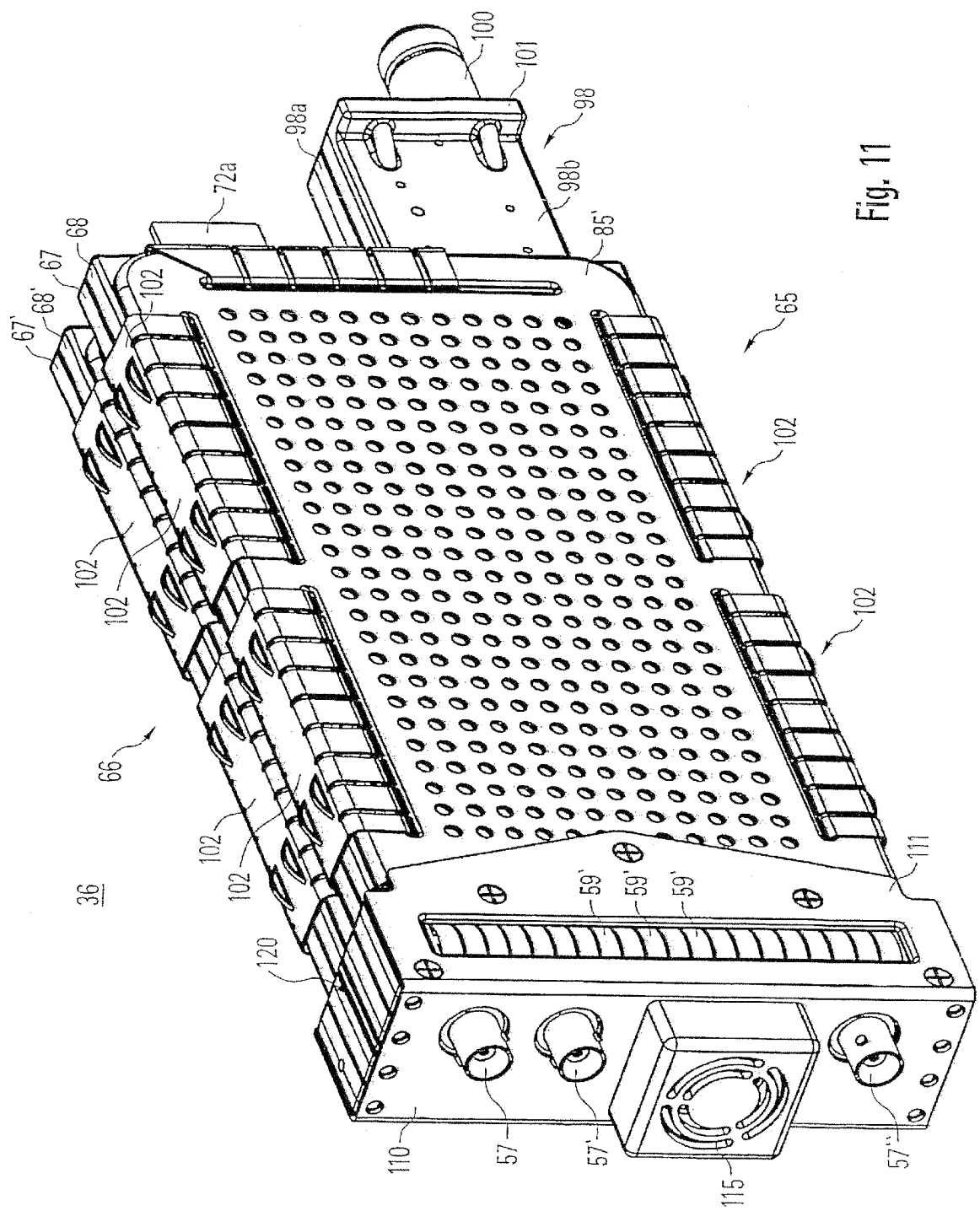
FIG. 11 shows a schematic presentation of a third measuring-device module according to the invention consisting of two base elements.

FIG. 11 once again shows the complete measuring-device module 36, the structure of which has already been explained in detail with reference to FIGS. 6 to 10. The measuring-device module 36 provides an electrical connection 100 facing towards the front of the measuring device 1, which can be formed, for example, as an N-socket or an ONC-socket. Three electrical connections 57, 57', and 57", which are designed as conventional connections for measuring devices, are arranged at the end of the measuring-device module 36 facing towards the rear of the measuring device 1. The measuring-device module 36 therefore has connections facing the front of the measuring device 1 and also facing the rear of the measuring device 1, so that, in the event of a simple change of the device under test, the measuring device 1 can still be operated exclusively from the front.

Figure 12:
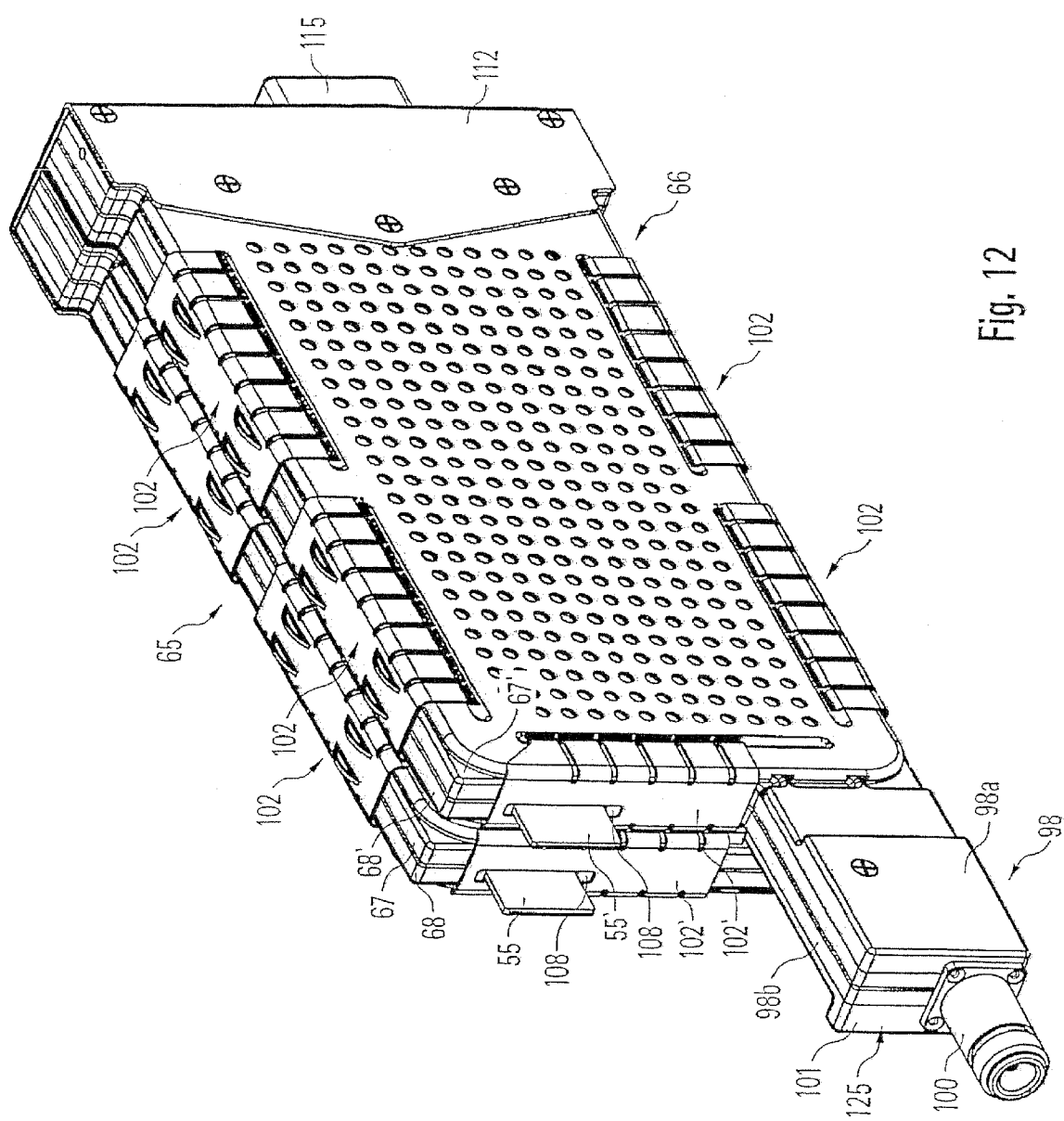
FIG. 12 shows a schematic presentation of a third measuring-device module according to the invention consisting of two base elements shown from a second perspective.

FIG. 12 once again shows the front of the measuring-device module 36. The electrical connection 100 is attached to the connection carrier 98, which is composed of the first connection carrier element 98a and the second connection carrier element 98b. As already explained in the description relating to FIG. 8, an enlargement of the volume surrounded by the connection carrier 98 in the direction towards the electrical connection 100 is achieved by a gradation of the base surface 99, which forms the outer limit of the connection carrier. As a result of this widening of the first connection-carrier element 98a, a mounting surface 125, which is composed of the front faces of the first connection carrier element 98a and 98b, is also enlarged. To allow an enlargement of this kind of the mounting surface 125, an additional attachment surface 101 is provided on the second connection-carrier element 98b. This surface 101 is used only to receive the electrical connection 100, but does not lead to an enlargement of the interior volume of the connection carrier 98.

In dependence upon the plug position in which the measuring-device module is inserted, the connection-carrier element 98b can also be provided with the gradation in order to enlarge the structural space and the additional attachment surface 101 can be formed on the first connection-carrier element 98a. The guide components 15 used to receive measuring-device modules, which have a connection-carrier 98, are provided with a larger gap because of the increased space requirement.

Figure 13:
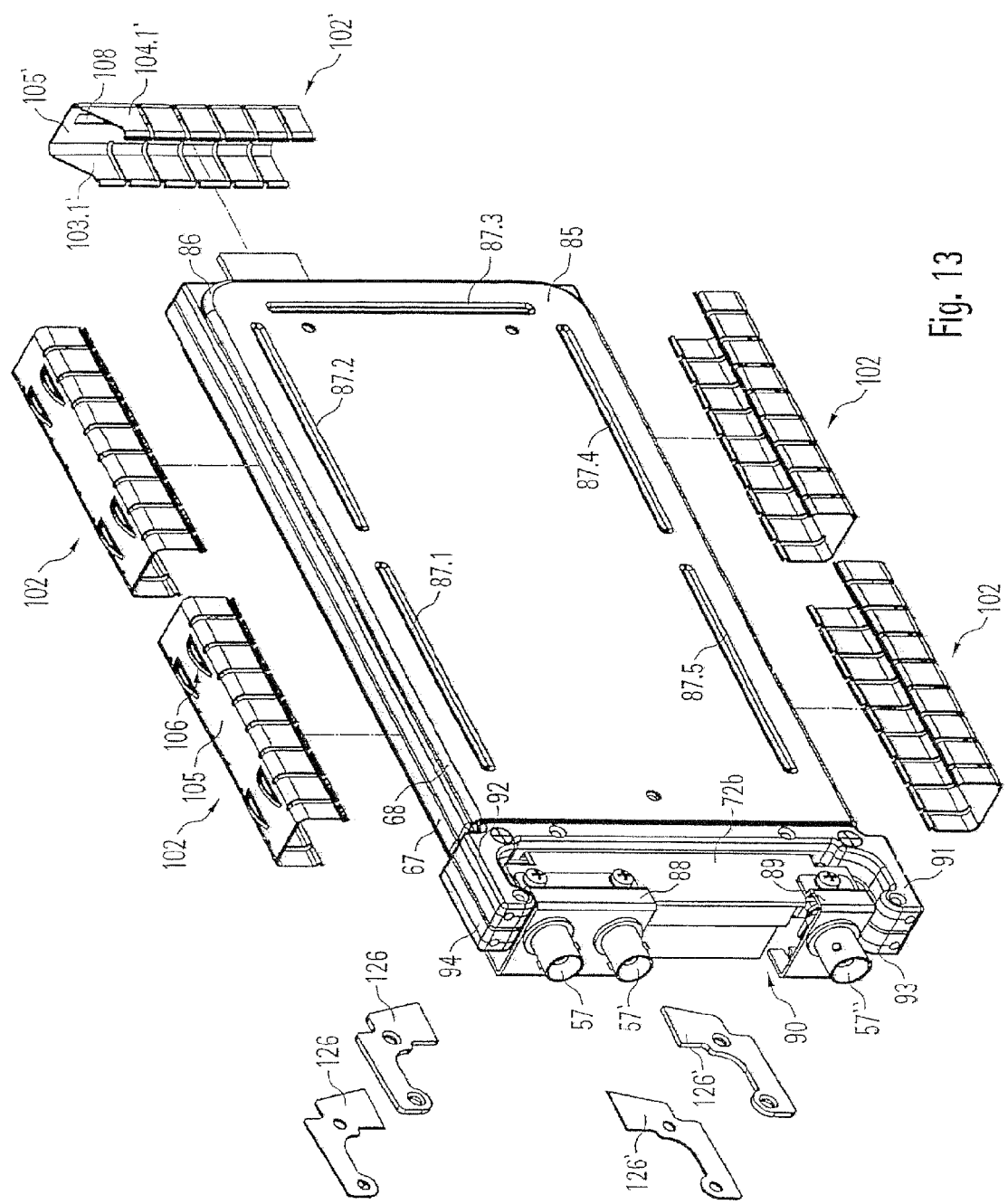
FIG. 13 shows a schematic presentation of a fourth measuring-device module according to the invention.

To improve the flow of cooling air, the spacing elements 120 can also be designed in two parts. Two-part spacing elements of this kind are shown in FIG. 13 with the reference numbers 126 and 126'. The spacing between base elements in this context is provided only in the region of the frame arms 91 to 94, so that the flow of cooling air entering between the cover plates 84 and 85 extends into the region of the spacing elements 126 and 126', where it flows into the additional printed-circuit-board space 90'. The cooling of the measuring-device module is considerably improved especially when using an additional fan 115.

Figure 14:
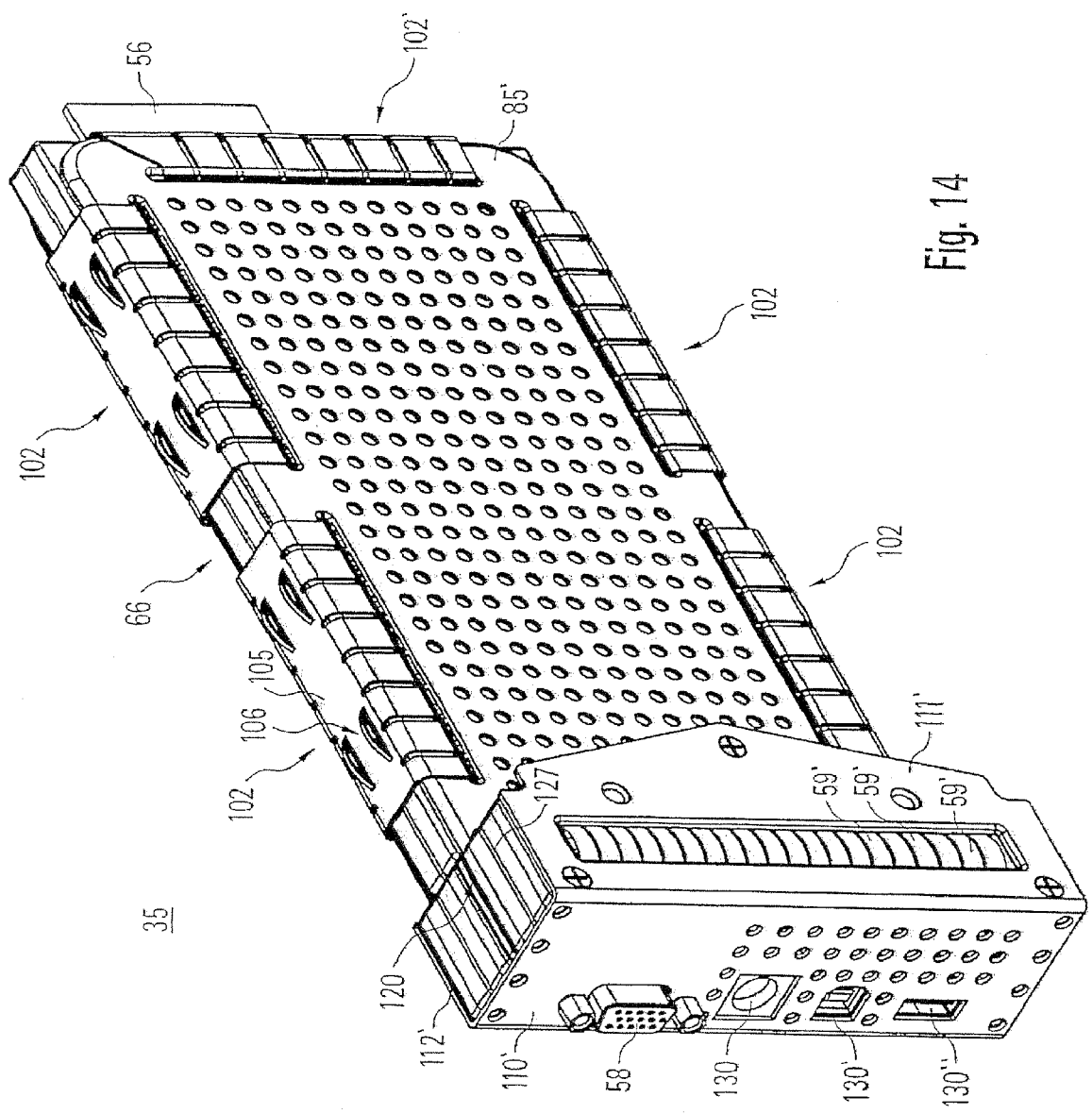
FIG. 14 shows a schematic presentation of the structure of a fifth measuring-device module according to the invention with a frame body.

FIG. 14 shows a measuring-device module 35 designed as a computer module. The measuring-device module 35 comprises a base element 66' and is connected at its end facing the rear of the measuring device to a frame body 127, which supplements the second printed-circuit-board space 90 forming an additional printed-circuit-board space 90'. The internal geometry of the frame body 12.7 corresponds to that of the spacing elements 120; however, its thickness corresponds to the width of the frame arms 91 to 94 of a base element. With a frame body 127 of this kind, a base element 66' is supplemented in such a manner, that the additional printed-circuit-board space 90', previously discussed in relation to the measuring-device module 36, is formed, without the need to connect a complete, second base element to the base element 66'. Spacing elements 120 are again inserted between the base element 66' and the frame body 127, so that the overall width of the measuring-device module 35 is once again a multiple of the grid dimension.

Various connections of the computer module project through the housing cover 110' including, inter alia, a video connection for connecting a monitor device. Furthermore, a row of additional connections 130, 131', and 130" is provided, with which the computer module can be connected, for example, to a network and additional input and output devices.

Figure 15:
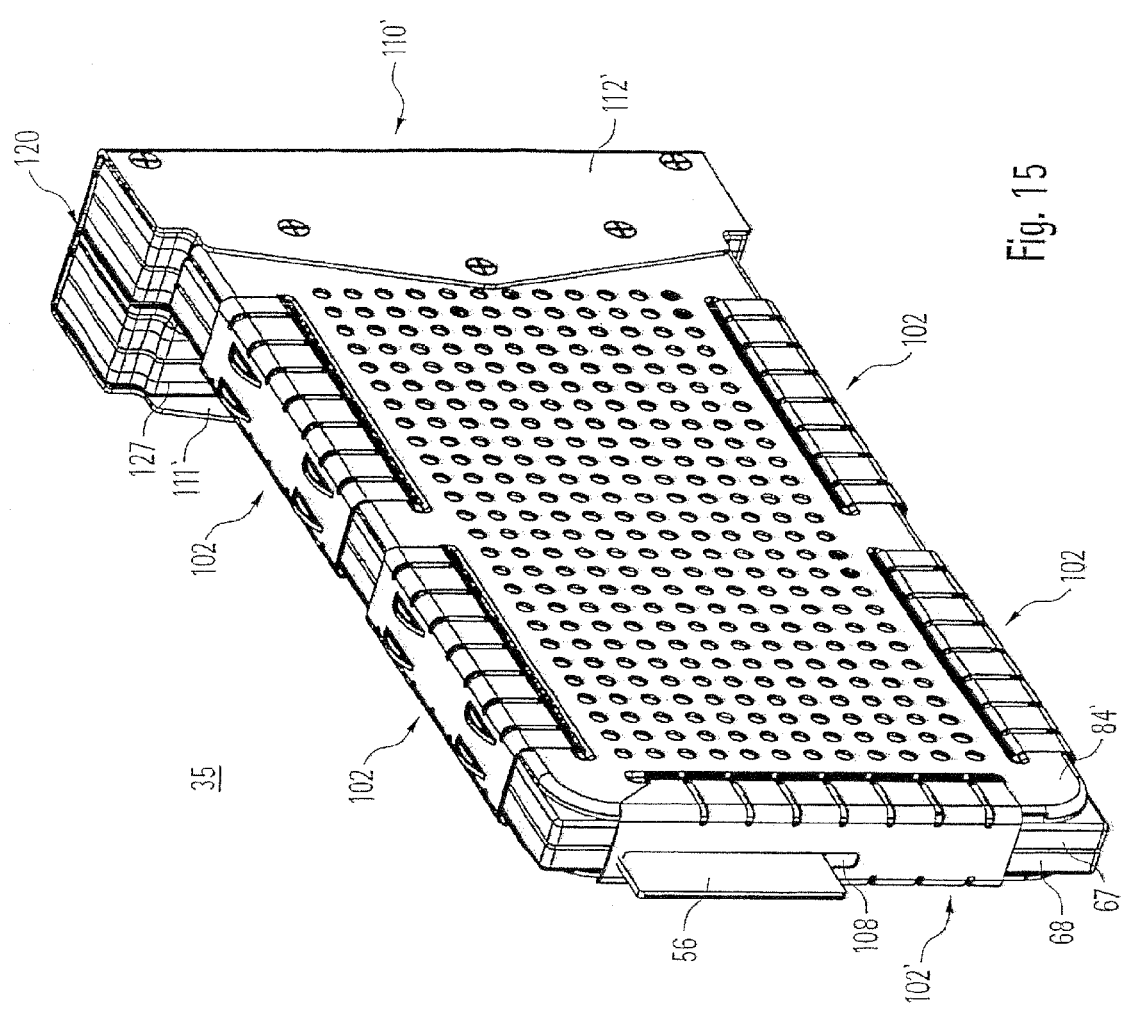
FIG. 15 shows a schematic presentation of the structure of a fifth measuring-device module according to the invention with a frame body from a second perspective.

FIG. 15 shows the computer module 35 from a second perspective. The diagram clearly shows how the frame body 127 supplements the structural width in the region of the second printed-circuit-board space 90 forming the additional printed-circuit-board space 90'. This additional printed-circuit-board space 90' is again enclosed by a common housing cover 110.

During the construction of the measuring device 1, two computer modules may also be provided; however, this is not illustrated. One computer model is used for communication with the information-output device 9, while the second computer module is used to control the measuring device 1 via external input and output devices and/or via a network, such as Ethernet.

In this context, the individual measuring-device modules form complete functional units, which, with an appropriate power supply, can also be operated outside the measuring device. This offers the advantage that an individual measuring-device module can be calibrated and the measuring-device modules calibrated in this manner can be interchanged. In particular, in the event of a retrospective replacement of a measuring-device module, for example, because of a fault, considerable cost savings can be achieved.

While illustrative embodiments have been illustrated and described, it will be appreciated that various changes can be made therein without departing from the spirit and scope of the invention.

The embodiments of the invention in which an exclusive property or privilege is claimed are defined as follows:

1. A measuring-device module for a measuring device, wherein the measuring-device module coinprises a plug-in contact element for the electrical connection of a plug-and-socket panel of the measuring device provided for data transfer, characterized in that the measuring-device module comprises a first base element with a first printed-circuit-board space for receiving a printed-circuit board and with a second printed-circuit-board space, and further comprising a second base element that can be connected to the first base element, the second base element having a first printed-circuit-board space for receiving a printed-circuit board and with a second printed-circuit-board space, and wherein the second printed-circuit-board space of the first base element, cooperatively with the second printed-circuit-board space of the second base element, forms a common additional printed-circuit-board space, and further wherein the printed-circuit board of the first base element is connected to the printed-circuit board of the second base element with an electrical connection arranged in the additional printed-circuit-board space.

2. The measuring-device module according to claim 1, characterized in that the first base element comprises oppositely disposed frame elements, each frame element having outwardly extending frame arms, and wherein the second printed-circuit-board space of the first base element is defined by the frame arms.

3. The measuring-device module according to claim 1, characterized in that at least one spacing element for adapting the measuring-device module to a grid dimension of the measuring device is arranged between the first base element and the second base element.

4. The measuring-device module according to claim 1, characterized in that at least one electrical connection element is provided, which is connected to the printed-circuit board of the first base element, or to an additional printed-circuit board in the second printed-circuit-board space or in the additional printed-circuit-board space.

5. The measuring-device module according to claim 1, characterized in that a connection carrier with a further electrical connection is provided at the end of a base element disposed opposite to the second printed-circuit-board space of the first base element.

\* \* \* \* \*